United States Patent
Liao et al.

(10) Patent No.: US 7,450,418 B2
(45) Date of Patent: Nov. 11, 2008

(54) NON-VOLATILE MEMORY AND OPERATING METHOD THEREOF

(75) Inventors: Hong-Yi Liao, Siluo Township, Yulin County (TW); Wu-Chang Chang, Beipu Township, Hsinchu County (TW); Ching-Yuan Lin, Jhudong Township, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 294 days.

(21) Appl. No.: 11/403,437

(22) Filed: Apr. 12, 2006

(65) Prior Publication Data

US 2007/0242523 A1    Oct. 18, 2007

(51) Int. Cl.
*G11C 11/34* (2006.01)

(52) U.S. Cl. .................. 365/185.05; 365/185.17; 365/185.26; 365/185.29

(58) Field of Classification Search ............ 365/185.05, 365/185.17, 185.18, 185.24, 185.26, 185.29, 365/185.33
See application file for complete search history.

(56) References Cited

U.S. PATENT DOCUMENTS

| 5,703,388 | A | | 12/1997 | Wang et al. ............... 257/315 |
|---|---|---|---|---|
| 5,761,121 | A | * | 6/1998 | Chang ................... 365/185.14 |
| 6,147,911 | A | * | 11/2000 | Takeuchi et al. ....... 365/185.28 |
| 6,522,583 | B2 | * | 2/2003 | Kanda et al. ........... 365/185.17 |
| 6,577,533 | B2 | * | 6/2003 | Sakui et al. ............ 365/185.05 |
| 7,245,530 | B2 | * | 7/2007 | Ichikawa et al. ....... 365/185.05 |
| 7,332,766 | B2 | * | 2/2008 | Hasegawa et al. ........... 257/315 |

* cited by examiner

*Primary Examiner*—VanThu Nguyen
*Assistant Examiner*—Alexander Sofocleous
(74) *Attorney, Agent, or Firm*—J.C. Patents

(57) ABSTRACT

An operating method of a non-volatile memory is provided. The non-volatile memory includes plural memory cells. Each memory cell includes a charge storage structure, a gate, and a source and a drain disposed in the well on the both sides of the gate. During an erasing operation, a first voltage is applied to the source of the selected memory cell, a second voltage is applied to the gate of each selected memory cell, and a third voltage is applied to the well; and the drain of the selected memory cell is floated, so that the selected memory cell is erased. In the meantime, the fourth voltage is applied to the drain of each unselected memory cell, the fifth voltage is applied to the gate of the unselected memory cell, and the source of the unselected memory cell is floated to prevent the unselected memory cell from being erased.

15 Claims, 7 Drawing Sheets

NON-VOLATILE MEMORY AND OPERATING METHOD THEREOF

BACKGROUND OF THE INVENTION

1. Field of the Invention

The present invention relates to a memory and an operating method thereof. More particularly, the present invention relates to a P-type channel non-volatile memory and an operating method thereof, wherein a byte erase operation can be performed.

2. Description of Related Art

Since EEPROM among non-volatile memories can be used to store, read, or erase data many times, and data stored in EEPROM will not be lost if the power is cut off, EEPROM has become a memory device widely used in personal computers and electronic apparatuses.

The typical EEPROM employs a doped poly-silicon material for fabricating the floating gate and control gate. Moreover, in order to prevent the problem of data error due to the severe over-erase phenomenon when the typical EEPROM erases, a select gate made of doped poly-silicon is further disposed on the sidewalls of the control gate and the floating gate and above the substrate, i.e. one select transistor is disposed on one side of the memory unit.

Referring to FIG. 1, a double-layer poly-silicon MONOS (metal/oxide/nitride/oxide/semiconductor) EEPROM is disclosed in U.S. Pat. No. 5,703,388 granted to Wang et al. The EEPROM includes a substrate 1, a field oxide layer 3, an N-type lightly doped region 11, a silicon oxide layer 5, a select gate 7, an ONO layer 13 and a control gate 15. The silicon oxide layer 5 is disposed on the substrate 1, and the select gate 7 is disposed on the silicon oxide layer 5. The ONO layer 13 is disposed on the lightly doped region 11 and extends to the select gate 7.

The EEPROM proposed by Wang et al., is a double-layer gate structure. When this N-type channel memory performs the programming operation, the hot carriers tunnel to the ONO layer through the channel region, so that charges are stored in the silicon nitride layer. During the erasing operation, the carriers tunnel to the drain through the ONO layer, so that the charges are discharged through the silicon nitride layer. Since a double-layer poly-silicon is required to be formed, it is hard to be integrated with other CMOS logic processes, and incurs expensive process adjustment and manufacturing costs, thus it is not applicable to the embedded memory.

Additionally, in the typical EEPROM, the erasing operation is directed to erasing all memory cells connected to a whole array in parallel, or all the memory cells in a broad sector of an array. Therefore, the erasing operation cannot be used for easing single object bytes, but must erase a whole array or sector. And, any part of the sector that need not be erased, that is, other than the object byte, must be re-programmed. Thus, an erasing/re-programming cycling is needed. This erasing/re-programming cycling is time consuming, and also causes higher power consumption.

SUMMARY OF THE INVENTION

In view of the above, an object of the present invention is to provide a P-type channel non-volatile memory and an operating method thereof, which can be integrated with ordinary CMOS logic processes, to improve the operation efficiency of the memory, and reduce power consumption.

Another object of the present invention is to provide a P-type channel non-volatile memory and the operating method thereof, wherein the selected memory cell in the memory are erased and programmed, so that the operation of the memory is more flexible.

The present invention provides a method of operating a P-type channel non-volatile memory. The P-type channel non-volatile memory includes a plurality memory cells disposed in the substrate, wherein each of the memory cells includes a charge storage structure, a gate, and a source and a drain disposed in the substrate on the both sides of the gate, wherein a well is further disposed in the substrate, and the memory cell is disposed on the well. The erasing operating includes the following steps.

A first voltage is applied to the source of a selected memory cell, a second voltage is applied to the gate of the selected memory cell and a third voltage is applied to the well; and the drain of the selected memory cell is floated. The first voltage is higher than the second voltage, and the third voltage is higher than the second voltage. Because the third voltage is higher than the second voltage, the channel of the memory cell forms an inversion channel, so that the first voltage applied to the source is conducted to the drain of the memory cell. Therefore, there is enough voltage across any gates and each of the ends (source, drain, and substrate). Thus, the selected memory cell is erased by an F-N tunneling effect.

Furthermore, a fourth voltage is applied to the drain of an unselected memory cell, a fifth voltage is applied to the gate of the unselected memory cell, and the source of the unselected memory cell is floated. In a similar way, as the third voltage is higher than the fifth voltage, the channel of the memory cell forms an inversion channel, so that the fourth voltage is conducted to the whole channel, or even to the source, and thus the whole channel is at the fourth voltage. With a particular design, the difference between the fifth voltage and the fourth voltage is reduced, so that electric field formed is insufficient, and thus the data stored in the memory cannot be erased by the F-N tunneling effect, and unselected memory cells are prevented from being erased (erase disturb).

According to an embodiment of the present invention, the charge storage structure described above includes, from bottom to top, a bottom dielectric layer, a charge storage layer and a top dielectric layer.

According to an embodiment of the present invention, the fifth voltage described above is equal to the second voltage.

According to an embodiment of the present invention, the first voltage is about 6 V, the second voltage is about −6 V, the third voltage is about 6 V, the fourth voltage is about 0 V, and the fifth voltage is about −6 V.

According to an embodiment of the present invention, the programming operation includes the following steps. A sixth voltage is applied to the source of a selected memory cell, a seventh voltage is applied to the drain of the selected memory cell, an eighth voltage is applied to the gate of the selected memory cell, and a ninth voltage is applied to the well. The sixth voltage is higher than the seventh voltage, and the eighth voltage is higher than the seventh voltage, so that the selected memory cell is programmed by the effect of channel hot hole induced hot electron injection.

Furthermore, a tenth voltage is applied to the source of the unselected memory cell, an eleventh voltage is applied to the gate of the unselected memory cell, and the drain of the unselected memory cell is floated, so as to prevent the unselected memory cell from being programmed.

According to an embodiment of the present invention, the tenth voltage described above is equal to the sixth voltage, and the eleventh voltage described above is equal to the eighth voltage.

According to an embodiment of the present invention, the sixth voltage described above is about 6 V, the seventh voltage is about 0 V, the eighth voltage is about 5 V, the ninth voltage is about 6 V, and the tenth voltage is about 6 V, and the eleventh voltage is about 5 V.

According to an embodiment of the present invention, the reading operation includes the following steps.

A twelfth voltage is applied to the source of a selected memory cell, a thirteenth voltage is applied to the drain of the selected memory cell, a fourteenth voltage is applied to the gate of the selected memory cell and a fifteenth voltage is applied to the well. The twelfth voltage is higher than the thirteenth voltage.

Furthermore, a sixteenth voltage is applied to the source of an unselected memory cell, a seventeenth voltage is applied to the gate of the unselected memory cell, and the sixteenth voltage is applied to the drain of the unselected memory cell or the drain of the unselected memory cell is floated, so as to prevent the reading result of the selected memory cell from being disturbed.

According to an embodiment of the present invention, the twelfth voltage described above is about 3.3 V, the thirteenth voltage is about 1.8 V, the fourteenth voltage is about 3.3 V, the fifteenth voltage is about 3.3 V, the sixteenth voltage is about 3.3 V, and the seventeenth voltage is about 3.3 V.

The present invention provides another method of operating a P-type channel non-volatile memory. The P-type channel non-volatile memory includes a plurality of memory cells disposed on a substrate. Each memory cell includes an access transistor and a memory transistor connected in series, wherein the drain of the access transistor is connected to the source of the memory transistor in series. The memory transistor includes a charge storage structure and a gate, and a well is disposed in the substrate. The memory cells are disposed on the well. The erasing operation includes the following steps.

A first voltage is applied to the source of the access transistor of a selected memory cell, the drain of the memory transistor of the selected memory cell is floated, a second voltage is applied to the gate of the access transistor of the selected memory cell, a third voltage is applied to the gate of the memory transistor of the selected memory cell, and a fourth voltage is applied to the well. The first voltage is higher than the second voltage, the first voltage is higher than the third voltage, and the fourth voltage is higher than the third voltage. Because the fourth voltage is higher than the third voltage, the channel of the memory transistor forms an inversion channel, so that the first voltage applied to the source is conducted to the drain of the memory cell. Therefore, there is enough voltage across the gates of the memory transistor and each of the ends (source, drain and substrate). Thus, the selected memory cell may be erased by an F-N tunneling effect.

A fifth voltage is applied to the drain of the memory transistor of the unselected memory cell, the source of the access transistor of the unselected memory cell is floated, a sixth voltage is applied to the gate of the access transistor of the unselected memory cell, and a seventh voltage is applied to the gate of the memory transistor of the unselected memory cell. The fourth voltage is higher than the seventh voltage. In a similar way, as the fourth voltage is higher than the seventh voltage, the channel of the memory transistor forms an inversion channel, so that the fifth voltage is conducted to the whole channel, or even to the source of the memory transistor, and thus the whole channel is at the fifth voltage. With a particular design, the difference between the fifth voltage and the seventh voltage is reduced, so that electric field formed is insufficient, and thus the data stored in the memory cannot be erased by the F-N tunneling effect, and unselected memory cells can be prevented from being erased (erase disturb).

According to an embodiment of the present invention, the charge storage structure described above, from bottom to top, includes a bottom dielectric layer, a charge storage layer and a top dielectric layer.

According to an embodiment of the present invention, the sixth voltage described above is equal to the second voltage, and the seventh voltage is equal to the third voltage.

According to an embodiment of the present invention, the programming operation includes the following steps. An eighth voltage is applied to the source of the access transistor of a selected memory cell, a ninth voltage is applied to the drain of the memory transistor of the selected memory cell, a tenth voltage is applied to the gate of the access transistor of the selected memory cell, an eleventh voltage is applied to the gate of the memory transistor of the selected memory cell, and a twelfth voltage is applied to the well. The eighth voltage is higher than the ninth voltage, the eighth voltage is higher than the tenth voltage, and the eleventh voltage is higher than the ninth voltage, so that the selected memory cell is programmed by the effect of channel hot hole induced hot electron injection.

Furthermore, a thirteenth voltage is applied to the source of the access transistor of an unselected memory cell, and the drain of the memory transistor of the unselected memory cell is floated. A fourteenth voltage is applied to the gate of the access transistor of the unselected memory cell, and a fifteenth voltage is applied to the gate of the memory transistor of the unselected memory cell, so as to prevent the unselected memory cell from being programmed.

According to an embodiment of the present invention, the eighth voltage described above is equal to the thirteenth voltage, the tenth voltage is equal to the fourteenth voltage, and the eleventh voltage is equal to the fifteenth voltage.

According to an embodiment of the present invention, the reading operation includes the following steps.

A sixteenth voltage is applied to the source of the access transistor of a selected memory cell, a seventeenth voltage is applied to the drain of the memory transistor of the selected memory cell, an eighteenth voltage is applied to the gate of the access transistor of the selected memory cell, a nineteenth voltage is applied to the gate of the memory transistor of the selected memory cell, and a twentieth voltage is applied to the well. The sixteenth voltage is higher than the seventeenth and the eighteenth voltages, so that the selected memory cell can be read.

Furthermore, a twenty-first voltage is applied to the source of the access transistor of an unselected memory cell, a twenty-second voltage is applied to the gate of the access transistor of the unselected memory cell, a twenty-third voltage is applied to the gate of the memory transistor of the unselected memory cell, and the twenty-first voltage is applied to the drain of the memory transistor of the unselected memory cell or the drain of the memory transistor of the unselected memory cell is floated, so that the reading result of the selected memory cell can be prevented from being disturbed.

According to an embodiment of the present invention, the first voltage described above is about 6 V, the second voltage is about 3.3 V, the third voltage is about −6 V, the fourth voltage is about 6 V, the fifth voltage is about 0 V, the sixth voltage is about 3.3 V, and the seventh voltage is about −6 V.

According to an embodiment of the present invention, the eighth voltage is about 6 V, the ninth voltage is about 0 V, the tenth voltage is about 0 V, the eleventh voltage is about 5 V, the twelfth voltage is about 6 V, the thirteenth voltage is about 6 V, the fourteenth voltage is about 0 V, and the fifteenth voltage is about 5 V.

According to an embodiment of the present invention, the sixteenth voltage is about 3.3 V, the seventeenth voltage is about 1.8 V, the eighteenth voltage is about 0 V, the nineteenth voltage is about 3.3 V, the twentieth voltage is about 3.3 V, the twenty-first voltage is about 3.3 V, the twenty-second voltage is about 0 V, and the twenty-third voltage is about 3.3 V.

The present invention provides a non-volatile memory including a substrate, a plurality of memory cells, a plurality of memory cells a plurality of word lines, a plurality bit lines, plural source lines and a plurality gate lines. The plural memory cells are disposed on the substrate. Each memory cell includes an access transistor, a memory transistor, a first transistor and a second transistor. The memory transistor includes a charge storage structure and a gate, and the source of the memory transistor is connected to the drain of the access transistor. The first transistor is disposed on the side of the access transistor, opposite to the side connected with the memory transistor. The second transistor is disposed on the side of the memory transistor, opposite to the side connected with the access transistor. The plural word lines are connected to the gates of the access transistors in the same column respectively. The plural bit lines are connected to the drains of the second transistors in the same column respectively. The plural source lines are connected to the sources of the first transistors in the same column respectively. The plural gate lines are connected to the gates of the memory transistors in the same column respectively.

According to an embodiment of the present invention, the charge storage structure described above includes a bottom dielectric layer, a charge storage layer, and a top dielectric layer. The material of the charge storage layer includes silicon nitride.

According to an embodiment of the present invention, a well is disposed on the substrate described above, and the access transistor and the memory transistor in each memory cell are disposed on the well.

According to an embodiment of the present invention, the substrate is included of a P-type conductivity, and the well is included of a N-type conductivity.

According to an embodiment of the present invention, the material of the gate includes doped poly-silicon.

According to an embodiment of the present invention, the first transistor described above is a P-type transistor or an N-type transistor. The second transistor is a P-type transistor or an N-type transistor.

The present invention provides a method of operating a P-type channel non-volatile memory suitable for a memory array. The memory array includes a plurality memory cells disposed on a substrate. Each memory cell includes a first transistor, an access transistor, a memory transistor, and a second transistor. A well is further disposed in the substrate, and at least the access transistor and the memory transistor are disposed on the well. The drain of the access transistor is connected to the source of the memory transistor. The first transistor is disposed on the side of the access transistor opposite to the side connected the memory transistor, and the second transistor is disposed on the side of the memory transistor opposite to the side connected the access transistor. The memory transistor includes a charge storage structure and a gate from bottom to top. The plural word lines are connected to the gates of the access transistors in the same column respectively. The bit lines are connected to the drains of the second transistors in the same column respectively. The source lines are connected to the sources of the first transistors in the same column respectively; and the plural gate lines are connected to the gates of the memory transistors in the same column respectively. The erasing operation, for example, includes the following steps.

A first voltage is applied to the source lines, and the channel below the first transistor of the selected memory cell is turned on, so that the potential of the source of the access transistor of the selected memory cell and the potential of the source lines are the same. A second voltage is applied to the bit lines, and the channel below the second transistor of the selected memory cell is turned off. The drain of the memory transistor is floated. A third voltage is applied to the gate lines, a fourth voltage is applied to the word lines, and a fifth voltage is applied to the well. The first voltage is higher than the third voltage, and the fifth voltage is higher than the third voltage, so that the selected memory cell can be erased by an F-N tunneling effect.

Furthermore, the channel below the first transistor of other unselected memory cell is turned off, the source of the access transistor of the unselected memory cell is floated, and the channel below the second transistor of the unselected memory cell is turned on, such that the potential of the drain of the memory transistor of the unselected memory cell and the potential of the bit lines are the same, so that the unselected memory cell is prevented from being erased.

According to an embodiment of the present invention, the charge storage structure described above includes a bottom dielectric layer, a charge storage layer and a top dielectric layer.

According to embodiment of the present invention, the programming operation includes the following steps. A sixth voltage is applied to the source lines, and the channel below the first transistor of the selected memory cell is turned on, such that the potential of the source of the access transistor of the selected memory cell and the potential of the source lines are the same. A seventh voltage is applied to the bit lines, and the channel below the second transistor of the selected memory cell is turned on, such that the potential of the drain of the memory transistor of the selected memory cell and the potential of the bit lines are the same. An eighth voltage is applied to the gate lines, a ninth voltage is applied to the word lines, and a tenth voltage is applied to the substrate. The sixth voltage is higher than the seventh voltage and the ninth voltage, and the eighth voltage is higher than the seventh voltage, so that the selected memory cell can be programmed by the effect of channel hot hole induced hot electron injection.

Furthermore, the channel below the first transistor of the unselected memory cell is turned on, so that the potential of the source of the access transistor of the unselected memory cell and the potential of the source lines are the same. The channel below the second transistor of the unselected memory cell is turned off, and the drain of the memory transistor of the unselected memory cell is floated, so as to prevent the unselected memory cell from being programmed.

According to an embodiment of the present invention, the reading operation described above further includes the following steps.

An eleventh voltage is applied to the source lines, and the channel below the first transistor of the selected memory cell is turned on, so that the potential of the source of the access transistor of the selected memory cell and the potential of the source lines are the same. A twelfth voltage is applied to the bit lines, and the channel below the second transistor of the selected memory cell is turned on, so that the potential of the drain of the memory transistor of the selected memory cell and the potential of the bit lines are the same. A thirteenth voltage is applied to the gate lines, a fourteenth voltage is applied to the word lines, and a fifteenth voltage is applied to the well. The eleventh voltage is higher than the twelfth voltage and the fourteenth voltage, so that the selected memory cell can be read.

Furthermore, the channel below the first transistor of an unselected memory cell is turned off, and the source of the access transistor of the unselected memory cell is floated. The channel below the second transistor of the unselected memory cell is turned off, and the drain of the memory transistor of the unselected memory cell is floated, so that the reading result of the selected cell is prevented from being disturbed.

According to an embodiment of the present invention, the first voltage is about 6 V, the second voltage is about 0 V, the third voltage is about −6 V, the fourth voltage is about 3.3 V, and the fifth voltage is about 6 V.

According to an embodiment of the present invention, the sixth voltage is about 6 V, the seventh voltage is about 0 V, the eighth voltage is about 5 V, the ninth voltage is about 0 V, and the tenth voltage is about 6 V.

According to an embodiment of the present invention, the eleventh voltage is about 3.3 V, the twelfth voltage is about 1.8 V, the thirteenth voltage is about 3.3 V, the fourteenth voltage is about 0 V, and the fifteenth voltage is about 3.3 V.

The P-type channel non-volatile memory provided by the present invention can be integrated with the ordinary CMOS logic processes, and the manufacturing process thereof is simple, thus reducing the fabrication cost and increasing the fabrication throughput.

Additionally, the operating method of the P-type channel non-volatile memory provided by the present invention is used for programming and erasing the selected memory cell by applying different voltages to the selected memory cell and on the unselected memory cell by the effect of the channel hot hole induced hot electron injection mechanism and F-N tunneling effect, thus preventing the unselected memory cell from being programmed and erased. This operating method improves the efficiency of the memory, and enables the writing and erasing operation of the memory to be flexible, i.e. byte by byte, without erasing/re-writing cycling many times, thus reducing power consumption and accelerating the operating speed of the element.

In order to the make aforementioned and other objects, features and advantages of the present invention comprehensible, preferred embodiments accompanied with figures are described in detail below.

DESCRIPTION OF EMBODIMENTS

Figure 1:
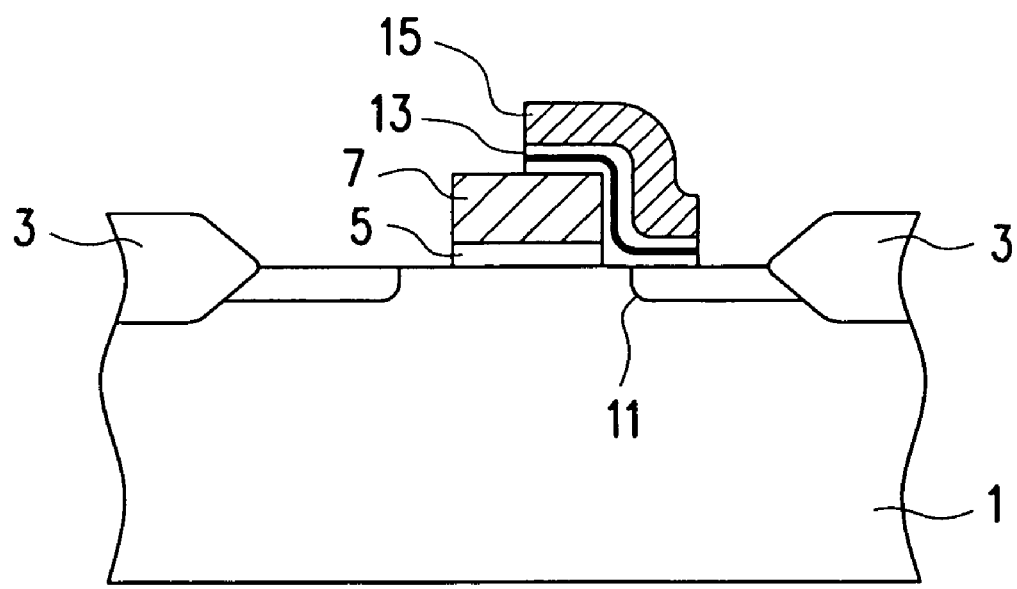
FIG. 1 is a sectional view of the conventional EEPROM.
Figure 2A:
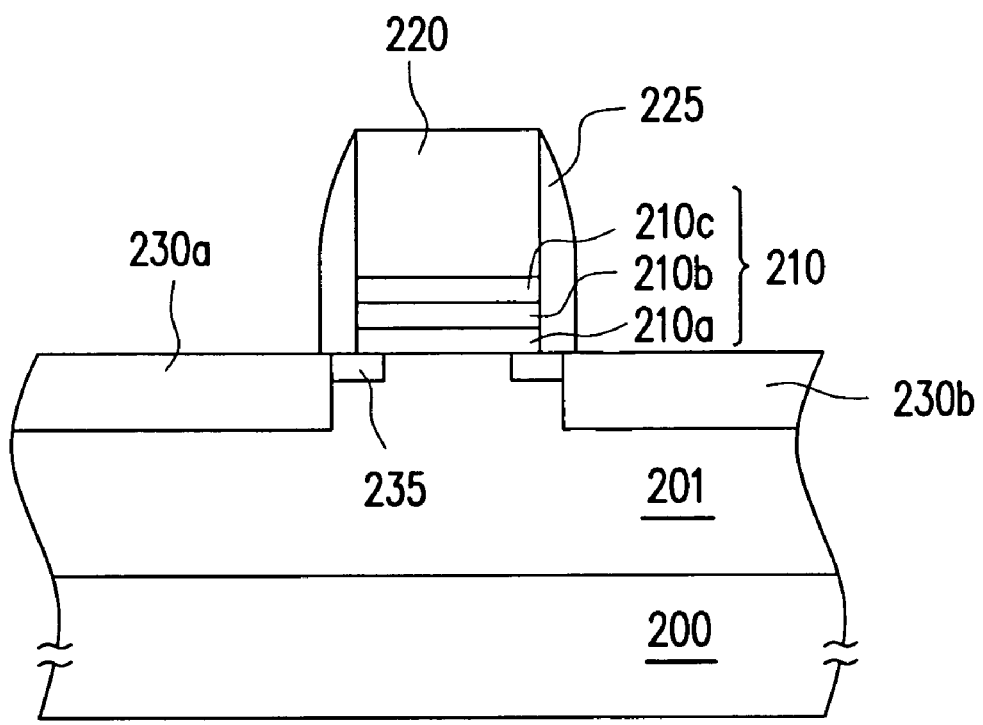
FIG. 2A depicts a sectional view of the P-type channel non-volatile memory according to an embodiment of the present invention.
Figure 2B:
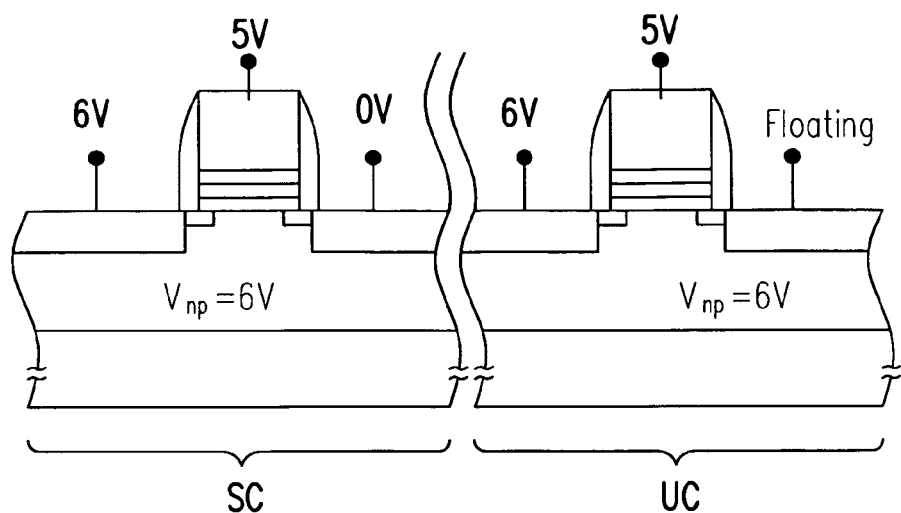
FIG. 2B depicts a schematic view of a programming operation mode of the P-type channel non-volatile memory according to an embodiment of the present invention.
Figure 2C:
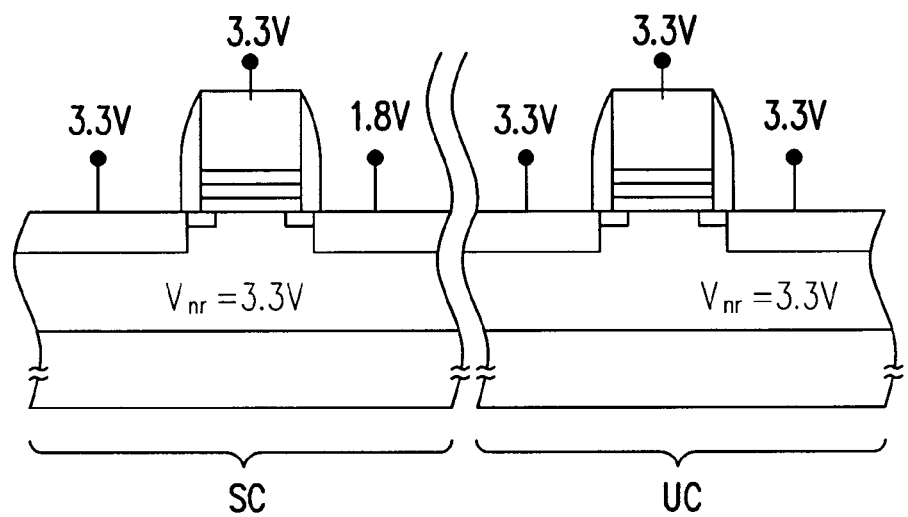
FIG. 2C depicts a schematic view of a reading operation mode of the P-type channel non-volatile memory according to an embodiment of the present invention.
Figure 2D:
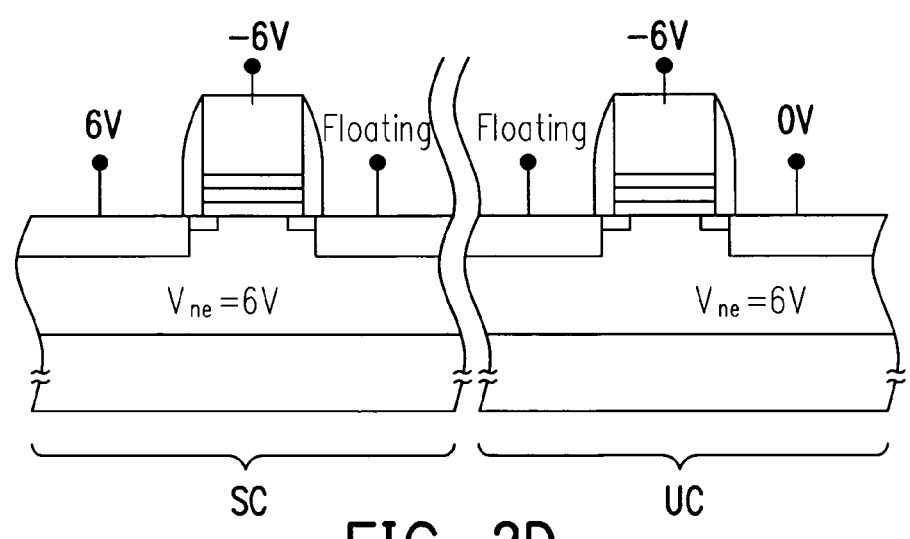
FIG. 2D depicts a schematic view of an erasing operation mode of the P-type channel non-volatile memory according to an embodiment of the present invention.

FIG. 2A depicts a sectional view of the P-type channel non-volatile memory according to an embodiment of the present invention. FIG. 2B depicts a schematic view of the programming operation mode of the P-type channel non-volatile memory according to an embodiment of the present invention. FIG. 2C depicts a schematic view of the reading operation mode of the P-type channel non-volatile memory according to an embodiment of the present invention. FIG. 2D depicts a schematic view of the erasing operation mode of the P-type channel non-volatile memory according to an embodiment of the present invention.

Referring to FIG. 2A, the operating method of the present invention is suitable for a P-type channel non-volatile memory. The P-type channel non-volatile memory, for example, includes a P-type substrate 200, an N-type well 201 disposed in the P-type substrate 200 and a plurality of memory cells disposed on the N-type well 201. The memory cells, for example, are arranged in a memory array. Each memory cell includes a charge storage structure 210, a gate 220 and a source 230a and a drain 230b on both sides of the gate.

The charge storage structure 210 includes a bottom dielectric layer 210a, a charge storage layer 210b and a top dielectric layer 210c. The material of bottom dielectric layer 210a and the top dielectric layer 210c include, for example, silicon oxide. The material of charge storage layer 210b includes, for example, doped poly-silicon or the charge can be trapped in, such as a silicon nitride layer, a silicon oxynitride layer, a tantalum oxide layer, a strontium titanate layer, or a hafnium oxide layer. The material of gate 220 includes, for example, a conductive material, such as doped poly-silicon containing P-type dopant, metal, or metal oxide. The source 230a and the drain 230b are, for example, P-type doped regions containing P-type dopant, such as boron.

A spacer 225, for example, is disposed on both sides of the gate 220, and the spacer 225 includes, for example, silicon oxide. A lightly doped region 235, for example, is disposed below the spacer 225 and close to the P-type substrate 200 of the source 230a and the drain 230b.

FIG. 2B to FIG. 2D depict the programming, reading, and erasing operation modes of the P-type channel-non-volatile memory, wherein the operation bias of the selected memory cell SC is depicted on the left, and the operation bias of another, unselected memory cell UC is depicted on the right.

Referring to FIG. 2B, when programming the selected memory cell SC, the voltage $V_{sp}$, for example, about 6 V, is applied to the source of the selected memory cell SC. The voltage $V_{dp}$, for example, about 0 V, is applied to the drain of the selected memory cell SC. The voltage $V_{gp}$, for example, about 5 V, is applied to the gate of the selected memory cell SC. The voltage $V_{np}$, for example, about 6 V, is applied to the N-type well. The voltage $V_{sp}$ of the source of the selected memory cell SC is higher than the voltage $V_{dp}$ of the drain thereof, and the voltage $V_{gp}$ of the gate of the selected memory cell SC is higher than the voltage $V_{dp}$ of the drain thereof, so that the selected memory cell can be programmed by the effect of channel hot hole induced hot electron injection.

When programming the selected memory cell SC, the voltage $V_{sp'}$, for example, about 6 V, is applied to the source of other unselected memory cell UC. The voltage $V_{gp'}$, for example, about 5 V, is applied to the gate of the unselected memory cell UC. The drain of the unselected memory cell UC is floated. Since no voltage is applied to the drain of the unselected memory cell, and the drain of the unselected memory cell is in floating state, the channel electric field between the drain and the source of the unselected memory cell UC is insufficient to induce the channel hot hole induced hot electron injection, and thus the unselected memory cell can be prevented from being programmed.

Referring to FIG. 2C, when reading the selected memory cell SC, the voltage $V_{sr}$, for example, about 3.3 V, is applied to the source of the selected memory cell SC. The voltage $V_{dr}$, for example, about 1.8 V, is applied to the drain of the selected memory cell SC. The voltage $V_{gr}$, for example, about 3.3 V, is applied to the gate of the selected memory cell SC. The voltage $V_{nr}$, for example, about 3.3 V, is applied to the N-type well. It can be judged whether the digital information stored in the selected memory cell SC is "1" or "0" by the channel switch/channel current.

When reading the selected memory cell SC, the voltage $V_{sr'}$, for example, about 3.3V, is applied to the rest unselected memory cell UC. The voltage $V_{gr'}$, for example, about 3.3V, is applied to the gate of the unselected memory cell UC. The voltage $V_{dr'}$, for example, about 3.3V, is applied to the drain of the unselected memory cell UC. Since the unselected memory cell UC is in a close state, and there is no voltage across the source and the drain, the reading result of the selected memory cell SC will not be affected.

Referring to FIG. 2D, when erasing the selected memory cell SC, the voltage $V_{se}$, for example, about 6 V, is applied to the source of selected memory cell SC. The drain of the selected memory cell SC is floated. The voltage $V_{ge}$, for example, about −6 V, is applied to the gate of the selected memory cell SC. The voltage $V_{ne}$, for example, about 6 V, is applied to the N-type well. The voltage $V_{se}$ of the source of the selected memory cell SC is higher than the voltage $V_{ge}$ of the gate thereof, and the voltage $V_{ne}$ of the N-type well is higher than the voltage $V_{ge}$ of the gate of the selected memory cell SC. Since the voltage $V_{ne}$ of the N-type well is higher than the voltage $V_{ge}$ of the gate of the selected memory cell SC, the channel of the selected memory cell SC will be formed as an inversion channel, so that the voltage $V_{se}$ applied to the source is conducted to the drain of the selected memory cell SC. As such, there will be enough voltage across the gates of the selected memory cell SC and each end (source, drain and substrate), the electrons can be drawn from the silicon oxide/silicon nitride/silicon oxide stack layer by an F-N tunneling effect, and thus the selected memory cell SC can be erased.

When erasing the selected memory cell SC, the voltage $V_{de'}$, for example, about 0 V, is applied to the drain of the unselected memory cell UC. The voltage $V_{ge'}$, for example, about −6 V, is applied to the gate of the unselected memory cell UC; and the source of the unselected memory cell UC is floated. In a similar way, as the voltage $V_{ne'}$ of the N-type well is higher than the voltage $V_{ge'}$ of the gate of the unselected memory cell UC, the channel of the unselected memory cell UC forms an inversion channel, so that the voltage $V_{de'}$ of the drain of the unselected memory cell UC is conducted to the whole channel, or even to the source, and thus the whole channel is at the voltage $V_{de'}$. With a particular design, the difference between the voltage $V_{ne'}$ of the N-type well and the voltage $V_{de'}$ of the drain of the unselected memory cell UC is reduced, so that electric field of the unselected memory cell UC formed is insufficient, and thus the data stored in the memory cannot be erased by the F-N tunneling effect. Therefore, if the electrons have already been stored in the unselected memory cell UC, the unselected memory cell UC can be prevented from being erased (erase disturb).

Although the P-type channel non-volatile memory, with the P-type substrate matching with the N-type well, is illustrated in the present embodiment, the present invention can also adopt the P-type channel non-volatile memory having the N-type substrate without the N-type well, or the N-type channel non-volatile memory, depending on the requirements of the element.

The method of operating the non-volatile memory described above is suitable for programming and erasing the selected single memory cell, without affecting other unselected memory cell. As such, the method of operating the memory is more flexible, and can be performed byte by byte.

Figure 3A:
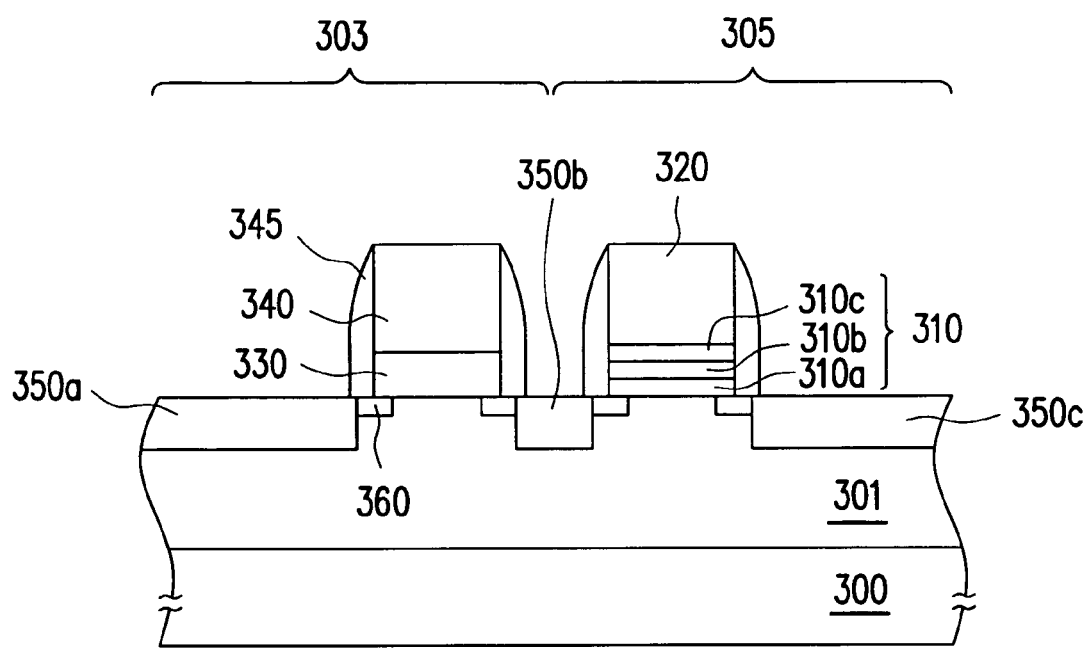
FIG. 3A depicts a sectional view of the P-type channel non-volatile memory according to another embodiment of the present invention.
Figure 3B:
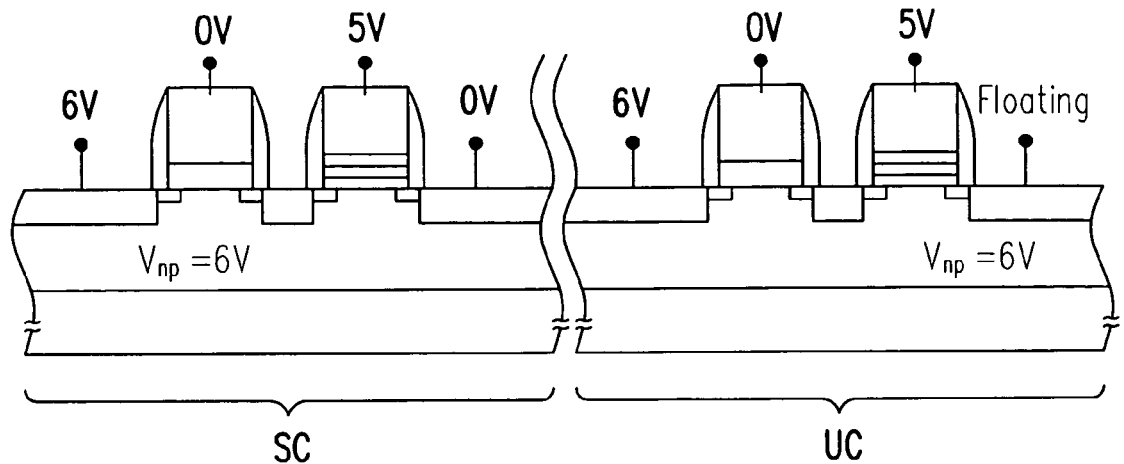
FIG. 3B depicts a schematic view of a programming operation mode of the P-type channel non-volatile memory according to another embodiment of the present invention.
Figure 3C:
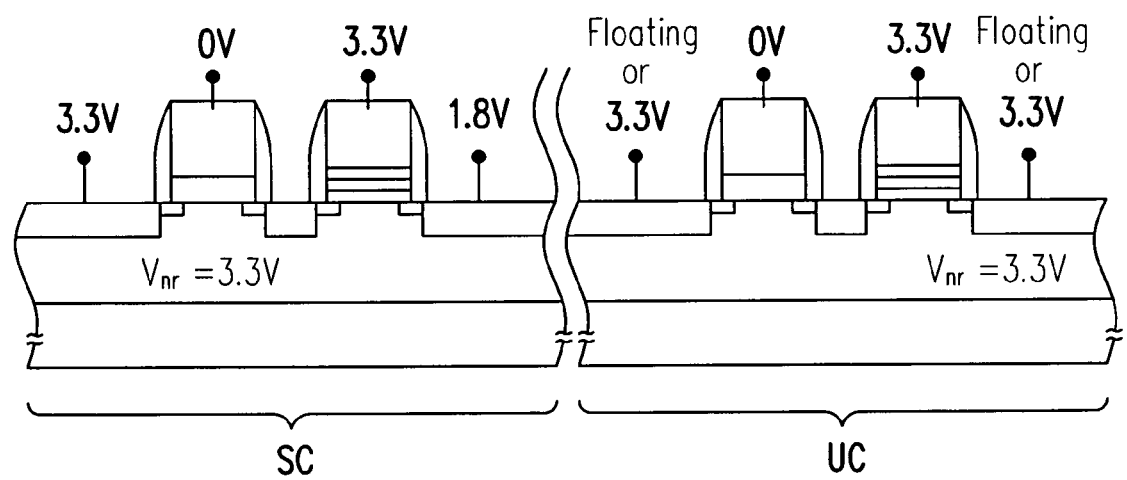
FIG. 3C depicts a schematic view of a reading operation mode of the P-type channel non-volatile memory according to another embodiment of the present invention.
Figure 3D:
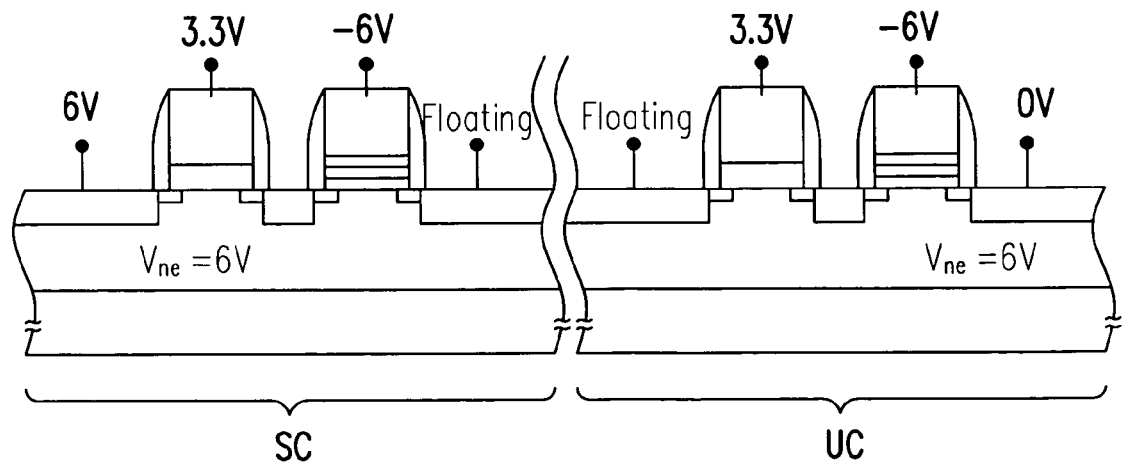
FIG. 3D depicts a schematic view of an erasing operation mode of the P-type channel non-volatile memory according to another embodiment of the present invention.

The method of operating the P-type channel non-volatile memory according to another embodiment of the present invention will be described below. FIG. 3A depicts a sectional view of the P-type channel non-volatile memory according to another embodiment of the present invention. FIG. 3B depicts a schematic view of the programming operation mode of the P-type channel non-volatile memory according to another embodiment of the present invention. FIG. 3C depicts a schematic view of the reading operation mode of the P-type channel non-volatile memory according to another embodiment of the present invention. FIG. 3D depicts a schematic view of the erasing operation mode of the P-type channel non-volatile memory according to another embodiment of the present invention.

Referring to FIG. 3A, the method of operating the memory according to the present invention can also be suitable for the P-type channel non-volatile memory with two transistors. The memory, for example, includes a P-type substrate 300, an N-type well 301 disposed in the P-type substrate 300 and a plurality of memory cells disposed on the N-type well 301. The memory cells, for example, form a memory array. Each memory cell includes an access transistor 303 and a memory transistor 305 connected in series. The memory transistor 305 includes a charge storage structure 310, a gate 320. The doped region 350a and the doped region 350b are disposed in the substrate 300 on both sides of the access transistor 303. The doped region 350b and the doped region 350c are disposed in the substrate 300 on both sides of the memory transistor 305, and the access transistor 303 shares the doped region 350b with the memory transistor 305. In other words, the doped region 350b acts as the drain of the access transistor 303 and the source of the memory transistor 305.

The charge storage structure 310 includes, for example, a bottom dielectric layer 310a, a charge storage layer 310b, and a top dielectric layer 310c. The material of the bottom dielectric layer 310a and the top dielectric layer 310c include, for example, silicon oxide. The material of the charge storage layer 310b include, for example, doped poly-silicon or a charge trapping layer containing charge trapping material, such as silicon nitride, tantalum oxide, strontium titanate, or hafnium oxide. The gate 320 includes, for example, doped poly-silicon containing P-type dopant, metal, or metal oxide.

The access transistor 303 includes, for example, a gate dielectric layer 330 and a gate 340. The gate dielectric layer 330 includes, for example, silicon oxide. The gate 340 includes, for example, a conductive material, such as doped poly-silicon containing P-type dopant, metal, or metal oxide. The sidewalls of the gates 340, 320 of the access transistor 303 and the memory transistor 305 are disposed with, for example, a spacer 345. The spacer 345 includes, for example, an insulating material, such as silicon oxide. A lightly doped region 360, for example, is disposed in the P-type substrate 300 below the spacer 345.

FIG. 3B to FIG. 3D, similarly to FIG. 2B to FIG. 2D, depict the programming, reading, and erasing operation modes of the P-type channel non-volatile memory, wherein the operation bias of the selected memory cell SC is depicted on the left, and the operation bias of another, unselected memory cell UC is depicted on the right.

Referring to FIG. 3B, when programming the selected memory cell SC, the voltage $V_{sp}$, for example, about 6 V, is applied to the source of the access transistor of the selected memory cell SC. The voltage $V_{dp}$, for example, about 0 V, is applied to the drain of the memory transistor of the selected memory cell SC. The voltage $V_{wp}$, for example, about 0 V, is applied to the gate of the access transistor of the selected memory cell SC. The voltage $V_{gp}$, for example, about 5 V, is applied to the gate of the memory transistor of the selected memory cell SC. The voltage $V_{np}$, for example, about 6 V, is applied to the N-type well. The voltage $V_{sp}$ of the source of the access transistor is higher than the voltage $V_{dp}$ of the drain of the memory transistor, and the voltage $V_{gp}$ of the gate of the memory transistor is higher than the voltage $V_{dp}$ of the drain of the memory transistor, so that the selected memory cell SC can be programmed by the effect of channel hot hole induced hot electron injection.

When programming the selected memory cell SC, the voltage $V_{sp'}$, for example, about 6 V, is applied to the source of the access transistor of the unselected memory cells UC. The drain of the memory transistor of the unselected memory cell UC is floated. The voltage $V_{gp'}$, for example, about 5 V, is applied to the gate of the memory transistor of the unselected memory cell UC. The voltage $V_{wp'}$, for example, about 0 V, is applied to the gate of the access transistor of the unselected memory cell UC. Since no voltage is applied to the drain of the memory transistor of the unselected memory cell UC, and the drain of the unselected memory cell is in floating state, the channel electric field between the drain and the source of the memory transistor of the unselected memory cell UC is not enough to induce the channel hot hole induced hot electron injection, and thus the unselected memory cell can be prevented from being programmed.

Referring to FIG. 3C, when reading the selected memory cell SC, the voltage $V_{sr}$, for example, about 3.3 V, is applied to the source of the access transistor of the selected memory cell SC. The voltage $V_{dr}$, for example, about 1.8 V, is applied to the drain of the memory transistor of the selected memory cell SC. The voltage $V_{gr}$, for example, about 3.3 V, is applied to the gate of the memory transistor of the selected memory cell SC. The voltage $V_{wr}$, for example, about 0 V, is applied to the gate of the access transistor of the selected memory cell SC; and the voltage $V_{nr}$, for example, about 3.3 V, is applied to the N-type well. It can be judged whether the digital information stored in the selected memory cell SC is "1" or "0" by the channel switch/channel current.

When reading the selected memory cell SC, the voltage $V_{sr'}$, for example, about 3.3V, is applied to the source of the access transistor of other unselected memory cell UC. The voltage $V_{wr'}$, for example, about 0 V, is applied to the gate of the access transistor of the selected memory cell SC. The voltage $V_{gr'}$, for example, about 3.3 V, is applied to the gate of the memory transistor of the unselected memory cell UC; and the voltage $V_{dr'}$, for example, about 3.3V, is applied to the drain of the memory transistor of the unselected memory cell UC. Since the unselected memory cell UC is in an off state, and there is no voltage across the source and the drain, the reading result of the selected memory cell SC will not be affected. Of course, in order to prevent the reading result of the selected memory cell SC from being disturbed, the source and the drain of the unselected memory cell UC are at equal level (3.3 V). Additionally, the source of the access transistor of the unselected memory cell UC and the drain of the memory transistor of the unselected memory cell UC can be floated at the same time, and thus the effect of avoiding reading disturbance also can be achieved.

Referring to FIG. 3D, when erasing the selected memory cell SC, the voltage $V_{se}$, for example, about 6 V, is applied to the source of the access transistor of the selected memory cell SC. The drain of the memory transistor of the selected memory cell SC is floated. The voltage $V_{ge}$, for example, about −6 V, is applied to the gate of the memory transistor of the selected memory cell SC. The voltage $V_{we}$, for example, about 3.3 V, is applied to the gate of the access transistor of the selected memory cell SC. The voltage $V_{ne}$, for example, about 6 V, is applied to the N-type well. The voltage $V_{ne}$ of the N-type well is higher than the voltage $V_{ge}$ of the gate of the memory transistor of the selected memory cell SC. Since the voltage $V_{ne}$ of the N-type well is higher than the voltage $V_{ge}$ of the gate of the selected memory cell SC, the channel of the selected memory cell SC will be formed as an inversion channel, so that the voltage $V_{se}$ applied to the source is conducted to the drain of the selected memory cell SC. As such, there will be enough voltage across the gate of the selected memory cell SC and each end (source, drain, and substrate), and the electrons can be drawn from the silicon oxide/silicon nitride/silicon oxide stack layer by an F-N tunneling effect, and thus the selected memory cell SC can be erased.

When erasing the selected memory cell SC, the voltage $V_{de'}$, for example, about 0 V, is applied to the drain of the memory transistor of the unselected memory cell UC. The source of the access transistor of the unselected memory cell UC is floated. The voltage $V_{ge'}$, for example, about −6 V, is applied to the gate of the memory transistor of the unselected memory cell UC. The voltage $V_{we'}$, for example, about 3.3 V, is applied to the gate of the access transistor of the unselected memory cell UC. In a similar way, as the voltage $V_{ne'}$ of the N-type well is higher than the voltage $V_{ge'}$ of the gate of the unselected memory cell UC, the channel of the unselected memory cell UC will be formed as an inversion channel, so that the voltage $V_{de'}$ of the drain of the unselected memory cell UC is conducted to the whole channel, or even to the source, and thus the whole channel is at the voltage $V_{de'}$. With a particular design, the difference between the voltage $V_{ne'}$ of the N-type well and the voltage $V_{de'}$ of the drain of the unselected memory cell UC is reduced, so that there is no sufficient electric field of the unselected memory cell UC formed, and thus the data stored in the memory cannot be erased by the F-N tunneling effect. Therefore, if the electrons have already been stored in the unselected memory cell UC, the unselected memory cell can be prevented from being erased.

The P-type channel non-volatile memory of the present embodiment has an extra access transistor, compared to the P-type channel non-volatile memory of the previous embodiment. By applying voltage on the gate of the access transistor, the channel below the transistor can be controlled to be turned on or turned off, so that the memory can be prevented form being over-erased, thus improving the efficiency of the memory.

Moreover, similar to the previous embodiment, although the P-type channel non-volatile memory having the P-type substrate matching with the N-type well is illustrated in the embodiment, the operating method is also suitable for the P-type channel non-volatile memory having an N-type substrate without the N-type well.

Figure 4A:
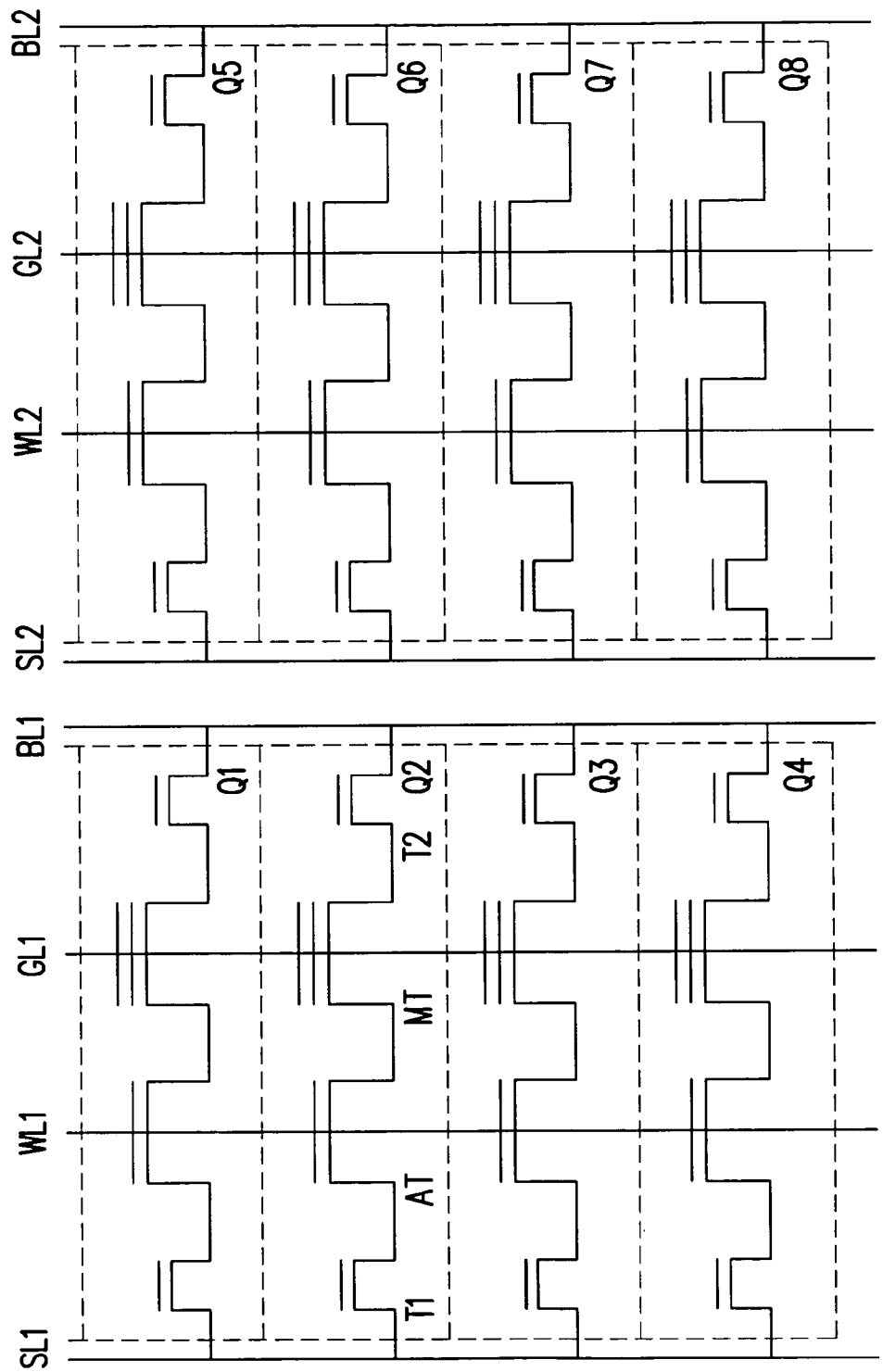
FIG. 4A depicts a circuit diagram of a P-type channel non-volatile memory array according to one embodiment of the present invention.
Figure 4B:
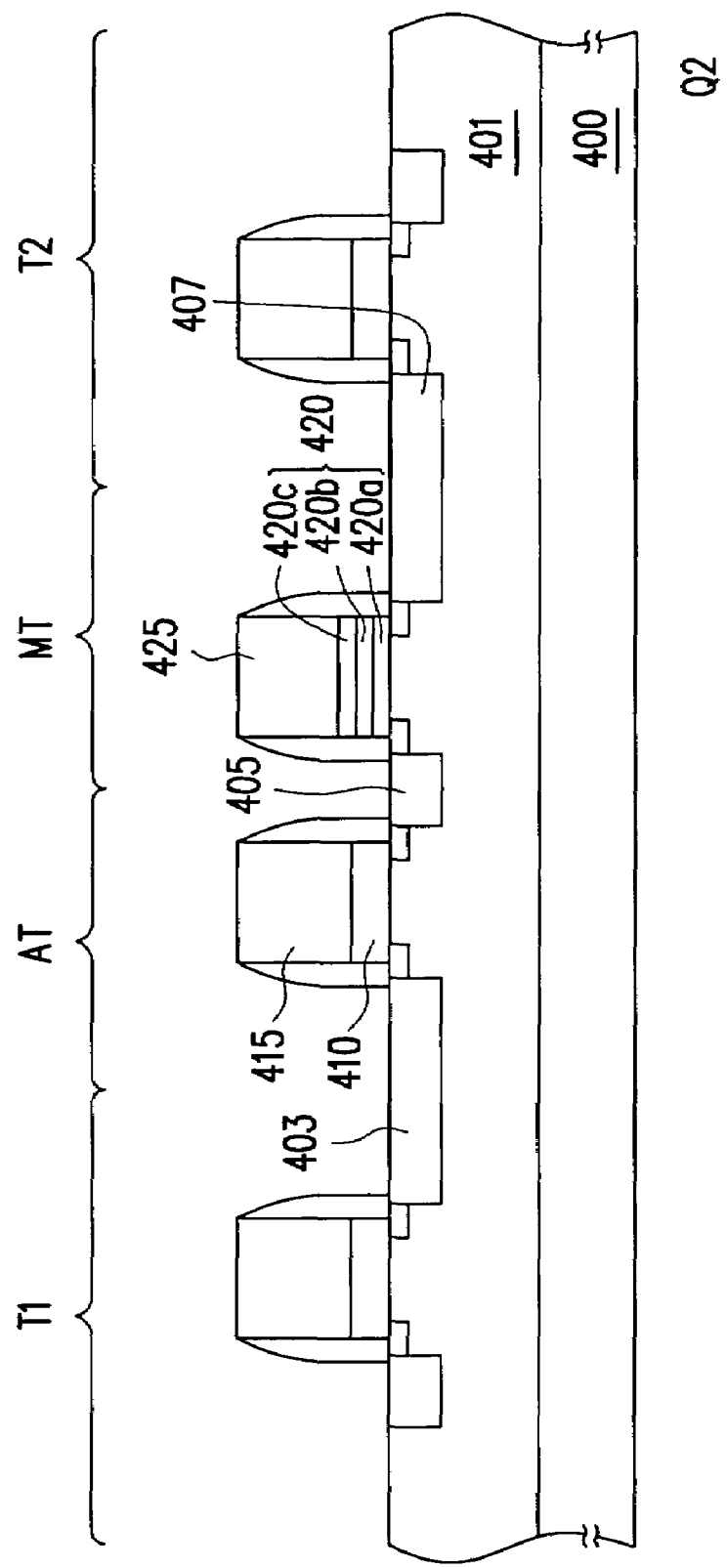
FIG. 4B depicts a structural sectional view of a memory cell in the P-type channel non-volatile memory array of FIG. 4A.

The P-type channel non-volatile memory provided by the present invention will be described below. FIG. 4A depicts a circuit diagram of the P-type channel non-volatile memory array according to one embodiment of the present invention. FIG. 4B depicts a sectional view of a memory cell in the P-type channel non-volatile memory array of FIG. 4A.

Referring to FIGS. 4A and 4B, the present invention provides a P-type channel non-volatile memory. The memory array includes a substrate 400, plural memory cells Q1-Q8, plural word lines WL1, WL2, plural bit lines BL1, BL2, plural source lines SL1, SL2, and plural gate lines GL1, GL2.

A plurality of memory cells Q1-Q8 is disposed on the substrate 400. Taking the memory cell Q2 as an example, the memory cell Q2, for example, includes an access transistor AT, a memory transistor MT, a first transistor T1, and a second transistor T2. A well 401 can be disposed in the substrate 400, and the access memory AT, the memory transistor MT, the first transistor T1, and the second transistor T2 of the memory cell Q2 are disposed in the well 401. In the present embodiment, the substrate 400 is, for example, a P-type substrate, and the well 401 is, for example, an N-type well.

The access transistor AT includes, for example, a gate oxide layer 410, a gate 415, and the doped regions 403, 405 disposed in the substrate 400 on both sides of the gate 415. The doped region 403 acts as the source of the access transistor AT, and the doped region 405 acts as the drain of the access transistor AT. The gate oxide layer 410 includes a dielectric material, such as silicon oxide. The gate 415 includes a conductive material, such as doped poly-silicon, metal, or metal silicide. The doped regions 403 and 405 are, for example, doped with P-type dopant.

The memory transistor MT, for example, includes a charge storage structure 420, a gate 425, and the doped regions 405, 407 on both sides of the gate 425 in the substrate 400. From bottom to top, the charge storage structure 420, for example, includes a bottom dielectric layer 420a, a charge storage layer 420b and a top dielectric layer 420c. The bottom dielectric layer 420a and the top dielectric layer 420b include, for example, silicon oxide. The charge storage layer 420b includes, for example, doped poly-silicon or a charge trapping material, such as silicon nitride, silicon oxynitride, tantalum oxide, strontium titanate, or hafnium oxide. The material of the gate 425 includes, for example, the same as that of the gate 415. The doped region 407 is, for example, a P-type doped region containing P-type dopant.

The source of the memory transistor MT is connected to the drain of the access transistor AT, i.e. the doped region 405 serves as both the drain of the access transistor AT and the source of the memory transistor MT. The doped region 407 serves as the drain of the memory transistor MT.

The first transistor T1 is disposed on the side of the access transistor AT, opposite to the side connected to memory transistor MT. The first transistor T1 is, for example, a P-type transistor, connected to the access transistor AT in series, i.e. the doped region 403 serves as both the source of the access transistor and the drain of the first transistor T1. The second transistor T2 is disposed on the side of the memory transistor MT, opposite to the side connected to the access transistor AT.

The second transistor T2 is, for example a P-type transistor, connected to the memory transistor MT in series, i.e. the doped region 407 is both the drain of the memory transistor MT and the source of the second transistor T2. The first transistor T1, the second transistor T2, and the access transistor AT have similar structures, i.e. they are the ordinary metal oxide semiconductor transistors, which will not be illustrated herein.

The sidewall of the gate in each transistor described above is, for example, provided with a spacer. The spacer includes, for example, an insulating material, such as silicon oxide. A lightly doped region, for example, is disposed in the substrate 400 below the spacer.

Referring to FIG. 4A, the plural word lines WL1 and WL2 are connected to the gate 415 of the access transistor AT of the memory cells Q1-Q4 and Q5-Q8 in the same column respectively. The plural bit lines BL1 and BL2 are connected to the drain of the second transistor T2 of the memory cells Q1-Q4 and Q5-Q8 in the same column respectively. The plural source lines SL1 and SL2 are connected to the source of the first transistor T1 of the memory cells Q1-Q4 and Q5-Q8 in the same column respectively; and the plural gate lines GL1 and GL2 are connected to the gate 425 of the memory transistor MT of the memory cells Q1-Q4 and Q5-Q8 in the same column respectively.

In FIG. 4A, the memory array is illustrated as including 4 memory cells in one column and 8 memory cells in two columns. Of course, 16 or 32 memory cells can also be connected in series in the same column of the memory array.

Moreover, the first transistor T1 and the second transistor T2 in the embodiment described above are illustrated using the P-type transistor. However, the first transistor T1 and second transistor T2 can also be the N-type transistors, or the first transistor T1 and the second transistor T2 are different conductivity-type transistors, depending on the design of the elements. Of course, if the first transistor T1 is an N-type transistor, the drain of the first transistor 1 and the source of the access transistor AT are not in the same doped region, and the first transistor T1 and the access transistor AT may be connected in series by other conductive material. The connection between the second transistor T2 and the memory transistor MT in series is similar to that between the first transistor 1 and the access transistor AT described above, which will not be described herein.

Additionally, it should be noted that although the P-type channel non-volatile memory having the P-type substrate 400 matching with the N-type well 401 is taken as an example in the present embodiment, the memory in the present invention can also be a P-type channel non-volatile memory having the N-type substrate without the N-type well.

The P-type channel non-volatile memory provided by the embodiment described above is a single poly-silicon layer structure, and can be integrated with ordinary CMOS logic processes, and the manufacturing process thereof is simple, thus reducing the fabrication cost and the fabrication throughput. Additionally, the P-type channel non-volatile memory has other advantages such as high operation speed and lower power consumption.

Refer to FIG. 4A and Table 1, the operation modes of the P-type channel non-volatile memory is apparent, which includes programming, erasing, data reading operations, and the like. The memory cell Q2 of the FIG. 4A is taken as an example in the following description.

TABLE 1

| | Operation Mode | | | | | |
| --- | --- | --- | --- | --- | --- | --- |
| | Programming | | Reading | | Erasing | |
| | Selected memory cell | Unselected memory cell | Selected memory cell | Unselected memory cell | Selected memory cell | Unselected memory cell |
| Source line | $V_{sp}$ (6 V) | $V_{sp'}$ (6 V) | $V_{sr}$ (3.3 V) | $V_{sr'}$ (3.3 V) | $V_{se}$ (6 V) | $V_{se'}$ (6 V) |
| Channel below the first transistor | open | open | open | close | open | close |
| bit line | $V_{bp}$ (0 V) | $V_{bp'}$ (0 V) | $V_{br}$ (1.8 V) | $V_{br'}$ (1.8 V) | $V_{be}$ (0 V) | $V_{be'}$ (0 V) |
| Channel below the second transistor | open | close | open | close | close | open |
| word line | $V_{wp}$ (0 V) | $V_{wp'}$ (0 V) | $V_{wr}$ (0 V) | $V_{wr'}$ (0 V) | $V_{we}$ (3.3) | $V_{we'}$ (3.3) |
| gate line | $V_{gp}$ (5 V) | $V_{gp'}$ (5 V) | $V_{gr}$ (3.3 V) | $V_{gr'}$ (3.3 V) | $V_{ge}$ (−6 V) | $V_{ge'}$ (−6 V) |
| N-type well | $V_{np}$ (6 V) | $V_{np'}$ (6 V) | $V_{nr}$ (3.3 V) | $V_{nr'}$ (3.3 V) | $V_{ne}$ (6 V) | $V_{ne'}$ (6 V) |

When programming the selected memory cell Q2, the voltage VSP, for example, about 6 V, is applied to the selected source line SL 1. The channel below the first transistor T1 of the selected memory cell Q2 is turned on, so that the potential of the source of the access transistor AT of the selected memory cell Q2 and the potential of the source line SL1 are the same. The voltage $V_{bp}$, for example, 0 V, is applied to the selected bit line BL1. The channel below the second transistor T2 of the selected memory cell Q2 is turned on, so that the potential of the drain of the memory transistor MT in the selected memory cell Q2 and the potential of the bit line BL1 are the same. The voltage $V_{gp}$, for example, about 5V, is applied to the selected gate line GL1. The voltage $V_{wp}$, for example, about 0 V is applied to the selected word line WL1. The voltage $V_{np}$, for example, about 6 V, is applied to the N-type well. The voltage $V_{sp}$ of the source line SLI is higher than the voltage $V_{bp}$ of the bit line BL1, and the voltage $V_{gp}$ of the gate line GL1 is higher than the voltage $V_{bp}$ of the bit line BL1, so that the selected memory cell Q2 can be programmed by the effect of channel hot hole induced hot electron injection.

When programming the selected memory cell Q2, the voltage $V_{sp'}$, for example, about 6 V, is applied to the unselected source line SL2. The channel below the first transistor of the unselected memory cells Q1, Q3, Q4, Q5, Q6, Q7, or Q8 is turned on, so that the potential of the source of the access transistor of the unselected memory cells and the potential of the source line coupled to the unselected memory cells are the same. The voltage $V_{bp'}$, for example, about 0, is applied to the unselected bit line BL2. The channel below the second transistor of the unselected memory cells Q1, Q3, Q4, Q5, Q6, Q7, or Q8 is turned off, so that the drain of the memory transistor of the unselected memory cells is in floating state. As such, although the memory cells Q1-Q4 are in the same column, and share the same source line SL1 and bit line BL1, the channel below the second transistor of the unselected memory cells Q1, Q3, and Q4 has been turned off, and the drain of the memory transistors is in the floating state, so that the unselected memory cells Q1, Q3, and Q4 can be prevented from being programmed, thus avoiding disturbing the programming. In a similar way, as the channels below the second transistor of the unselected memory cells Q5-Q8 are turned off, the unselected memory cells Q5-Q8 also will not go through the programming encoding operation.

When reading the selected memory cell Q2, the voltage $V_{sr}$, for example, about 3.3 V, is applied to the source lines SL1 and SL2. The voltage $V_{dr}$, for example, about 1.8 V, is applied to the bit lines BL1 and BL2. The voltage $V_{wr}$, for example, about 0 V, is applied to the word lines WL1 and WL2. The voltage $V_{gr}$, for example, about 3.3 V, is applied to the gate lines GL1 and GL2; and the voltage $V_{nr}$, for example, about 3.3 V, is applied to the N-type well. The channel below the first transistor T1 of the selected memory cell Q2 is turned on, so that the potential of the source of the access transistor AT of the selected memory cell Q2 and the potential of the source line SL1 are the same. The channel below the second transistor T2 of the selected memory cell Q2 is turned on, so that the potential of the drain of the memory transistor MT of the selected memory cell Q2 and the potential of the bit line BL1 are the same. It can be judged whether the digital information stored in the memory cell is "1" or "0" through the channel switch/channel current of the selected memory cell Q2.

When performing the reading operation on the selected memory cell Q2, the channel below the first transistor of the unselected memory cells Q1, Q3, Q4, Q5, Q6, Q7, or Q8 is turned off, and the source of the access transistor of the unselected memory cells is floated. The channel below the second transistor of the unselected memory cells Q1, Q3, Q4, Q5, Q6, Q7, or Q8 is turned off, and the drain of the memory transistor of the unselected memory cells is floated. Although the unselected memory cells Q1, Q3, and Q4 and the selected memory cell Q2 share the same source line SL1 and bit line BL1, the channel below the first transistor and the channel below the second transistor have been turned off (equal to the case that the memory transistor of the unselected memory cells are turned off), so that the reading result of the selected memory cell Q2 can be prevented from being disturbed.

When performing the erasing operation on the selected memory cell Q2, the voltage $V_{se}$, for example, of about 6 V, is applied to the source line SL1. The channel below the first transistor T1 of the selected memory cell Q2 is turned on, so that the potential of the source of the access transistor AT in the selected memory cell Q2 and the potential of the source line SL1 are the same. The voltage $V_{be}$, for example, about 0 V, is applied to the selected bit line BL1. The channel below the second transistor T2 of the selected memory cell Q2 is turned off, and the drain of the memory transistor MT is floated. The voltage $V_{ge}$, for example, about −6 V, is applied to the selected gate line GL1. The voltage $V_{we}$, for example, about 3.3 V, is applied to the selected word line WL1; and the voltage $V_{ne}$, for example, about 6 V is applied to the N-type well. Since the voltage $V_{ne}$ of the N-type well is higher than the voltage $V_{ge}$ of the gate line coupled to the selected memory cell Q2, the channel of the selected memory cell Q2 will be formed as an inversion channel, so that the voltage $V_{se}$ applied to the source is conducted to the drain of the selected memory cell Q2. As such, there will be enough voltage across the gate of the selected memory cell Q2 and each end (source, drain, and substrate), and thus the selected memory cell Q2 can be erased by an F-N tunneling effect.

When performing the erasing operation on the selected memory cell Q2, the channel below the first transistor of the unselected memory cells Q1, Q3, Q4, Q5, Q6, Q7, or Q8 is turned off, so that the source of the access transistor of the unselected memory cells is floated. The channel below the second transistor of the unselected memory cells Q1, Q3, Q4, Q5, Q6, Q7, or Q8 is turned on, so that the potential of the drain of the memory transistor of the unselected memory cells and the potential of the coupled bit line are the same. In a similar way, as the voltage $V_{ne'}$ of the N-type well is higher than the voltage $V_{ge'}$ of the gate of the memory transistor of the unselected memory cells Q1, Q3, Q4, Q5, Q6, Q7, or Q8, the channel of the unselected memory cell will be formed as an inversion channel, so that the voltage $V_{de'}$ of the drain of the memory transistor of the unselected memory cells is conducted to the whole channel, and thus the whole channel is at the voltage $V_{de'}$. With a particular design, the difference between the voltage $V_{ne'}$ of the N-type well and the voltage $V_{de'}$ of the drain of the unselected memory cells Q1, Q3, Q4, Q5, Q6, Q7, or Q8 is reduced, so that the electric field of the unselected memory cell is insufficient, and thus the data stored in the memory cannot be erased by the F-N tunneling effect. As such, even if the memory cells Q1-Q4 in the same column share the same source line SL1 and the bit line BL1, the problem of erase disturbance can be prevented due to the insufficient electric field of the unselected memory cells.

Although P-type channel non-volatile memory having the P-type substrate matching with the N-type well is taken as an example in the present embodiment, the present invention can also adopt P-type channel non-volatile memory with N-type substrate without N-type well, or N-channel non-volatile memory. The operating method thereof is well known to those skilled in the art, thus will not be illustrated herein.

In the operating method described above, the first and second transistors are used to control the switch below the channel, so that the programming and erasing operation can be performed on the selected memory cells, and the unselected memory cells can be prevented from being written or erased. As such, the operation of the memory is more flexible, without erasing/re-writing cycling many times, thus reducing the power consumption required by the element.

In view of the above, the P-type channel non-volatile memory provided by the present invention can be integrated with the ordinary CMOS logic processes, and its manufacturing process is simple, thus reducing the fabrication cost and increasing the fabrication throughput.

Additionally, in the method of operating the P-type channel non-volatile memory provided by the present invention, the programming operation and the erasing operation can be performed directed to the selected memory cell, so that unselected memory cells are prevented from being written or erased. This operating method enables the operation of the memory to be performed in a more flexible manner, i.e. byte by byte, without erasing/re-writing cycling many times, thus reducing power consumption and accelerating the operating speed of the element. Furthermore, by controlling the voltage of each word line, bit line, source line, and gate line and switch of the channel below the transistor, the programming and erasing operation can be performed in units of byte, sector, or block.

The present invention has been disclosed above in the preferred embodiments, but is not limited to these. It is known to persons skilled in the art that some modifications and innovations may be made without departing from the spirit and scope of the present invention. Therefore, the scope of the present invention should be defined by the following claims.

What is claimed is:

1. A non-volatile memory, comprising:
   a substrate;
   a plurality of memory cells, disposed over the substrate, each memory cell including:
   an access transistor;
   a memory transistor, having a charge storage structure and a gate, and the source of the memory transistor being connected to the drain of the access transistor;
   a first transistor, disposed on the side of the access transistor, opposite to the side connected with the memory transistor; and
   a second transistor, disposed on the side of the memory transistor, opposite to the side connected with the access transistor;
   a plurality of word lines, connected to the gates of the access transistors in the same column respectively;
   a plurality of bit lines, connected to the drains of the second transistors in the same column respectively;
   a plurality of source lines, connected to the sources of the first transistors in the same column respectively; and
   a plurality of gate lines, connected to the gates of the memory transistors in the same column respectively.

2. The non-volatile memory as claimed in claim 1, wherein the charge storage structure comprises a bottom dielectric layer, a charge storage layer and a top dielectric layer.

3. The non-volatile memory as claimed in claim 2, wherein the material the material of the charge storage layer comprises silicon nitride.

4. The non-volatile memory as claimed in claim 1, wherein a well is disposed on the substrate, and the access transistor and the memory transistor in each memory cell are disposed on the well.

5. The non-volatile memory as claimed in claim 4, wherein the substrate comprises a P-type conductivity, and the well comprises a N-type conductivity.

6. The non-volatile memory as claimed in claim 1, wherein the material of the gate comprises doped poly-silicon.

7. The non-volatile memory as claimed in claim 1, wherein the first transistor comprises a P-type transistor or an N-type transistor.

8. The non-volatile memory as claimed in claim 1, wherein the second transistor comprises a P-type transistor or an N-type transistor.

9. A method of operating a P-type channel non-volatile memory suitable for a memory array, wherein the memory array comprises a plurality of memory cells disposed over a substrate, and each memory cell comprises a first transistor, an access transistor, a memory transistor, and a second transistor, wherein a well is further disposed in the substrate, and at least the access transistor and the memory transistor are disposed on the well, and the drain of the access transistor connects the source of the memory transistor, and the first transistor is disposed on the side of the access transistor, opposite to the side connected to the memory transistor, and the second transistor is disposed on the side of the memory transistor, opposite to the side connected to the access transistor, and the memory transistor comprises a charge storage structure and a gate; a plurality of word lines, connected to the gates of the access transistors in the same column respectively; a plurality of bit lines, connected to the drains of the second transistors in the same column respectively; a plurality of source lines, connected to the sources of the first transistors in the same column respectively; a plurality of gate lines, connected to the gates of the memory transistors in the same column respectively, the operating method comprising:

applying a first voltage to the source lines, turning on the channel below the first transistor of the selected memory cell, so that a potential of the source of the access transistor of the selected memory cell and a potential of the source lines are the same, applying a second voltage to the bit lines, turning off the channel below the second transistor of the selected memory cell, floating the drain of the memory transistor, applying a third voltage on the gate lines, applying a fourth voltage on the word lines, and applying a fifth voltage on the well, wherein the first voltage is higher than the third voltage, and the fifth voltage is higher than the third voltage, so that the selected memory cell is erased by an F-N tunneling effect; and turning off the channel below the first transistor of an unselected memory cell, and floating the source of the access transistor of the unselected memory cell, turning on the channel below the second transistor of the unselected memory cell, so that a potential of the drain of the memory transistor of the unselected memory cell and a potential of the bit lines are the same to prevent the unselected memory cell from being erased.

10. The method of operating a P-type channel non-volatile memory as claimed in claim 9, wherein the charge storage structure comprises a bottom dielectric layer, a charge storage layer and a top dielectric layer.

11. The method of operating a P-type channel non-volatile memory as claimed in claim 9, wherein the operating method further comprises performing a programming operation by following steps: applying a sixth voltage to the source lines, turning on the channel below the first transistor of the selected memory cell, so that a potential of the source of the access transistor of the selected memory cell and a potential of the source lines are the same, applying a seventh voltage to the bit lines, turning on the channel below the second transistor of the selected memory cell, so that a potential of the drain of the memory transistor of the selected memory cell and a potential of the bit lines are the same, applying an eighth voltage to the gate lines, applying a ninth voltage to the word lines, and applying a tenth voltage to the well, wherein the sixth voltage is higher than the seventh voltage and the ninth voltage, and the eighth voltage is higher than the seventh voltage, so that the selected memory cell is programmed by the effect of channel hot hole induced hot electron injection; and turning on the channel below the first transistor of the unselected memory cell so that a potential of the source of the access transistor of the unselected memory cell and a potential of the source lines are the same, turning off the channel below the second transistor of the unselected memory cell, and floating the drain of the memory transistor of the unselected memory cell, so as to prevent the unselected memory cell from being programmed.

12. The method of operating a P-type channel non-volatile memory as claimed in claim 11, wherein the sixth voltage is about 6 V, the seventh voltage is about 0 V, the eighth voltage is about 5 V, the ninth voltage is about 0 V, and the tenth voltage is about 6 V.

13. The method of operating a P-type channel non-volatile memory as claimed in claim 9, wherein the operating method further comprises performing a reading operation by following steps: applying an eleventh voltage to the source lines, turning on the channel below the first transistor of the selected memory cell, so that the potential of the source of the access transistor of the selected memory cell and the potential of the source lines are the same, applying a twelfth voltage to the bit lines, turning on the channel below the second transistor of the selected memory cell, so that a potential of the drain of the memory transistor of the selected memory cell and a potential of the bit lines are the same, applying a thirteenth voltage to the gate lines, applying a fourteenth voltage to the word lines, and applying a fifteenth voltage to the well, wherein the eleventh voltage is higher than the twelfth voltage and the fourteenth voltage, so that the selected memory cell is read; and turning off the channel below the first transistor of an unselected memory cell, floating the source of the access transistor of the unselected memory cell, turning off the channel below the second transistor of the unselected memory cell, and floating the drain of the memory transistor of the unselected memory cell, so as to prevent the reading result of the selected cell from being disturbed.

14. The method of operating a P-type channel non-volatile memory as claimed in claim 13, wherein the eleventh voltage is about 3.3 V, the twelfth voltage is about 1.8 V, the thirteenth voltage is about 3.3 V, the fourteenth voltage is about 0 V, and the fifteenth voltage is about 3.3 V.

15. The method of operating a P-type channel non-volatile memory as claimed in claim 9, wherein the first voltage is about 6 V, the second voltage is about 0 V, the third voltage is about −6 V, the fourth voltage is about 3.3 V, and the fifth voltage is about 6 V.

* * * * *